(12) United States Patent
Lowance

(10) Patent No.: US 12,006,927 B2
(45) Date of Patent: Jun. 11, 2024

(54) ELECTRICALLY ACTUATED PUMP

(71) Applicant: World Club Supply Corporation, Orange, CA (US)

(72) Inventor: Philip D. Lowance, Dana Point, CA (US)

(73) Assignee: World Club Supply Corp., Orange, CA (US)

( * ) Notice: Subject to any disclaimer, the term of this patent is extended or adjusted under 35 U.S.C. 154(b) by 0 days.

(21) Appl. No.: 17/829,219

(22) Filed: May 31, 2022

(65) Prior Publication Data
US 2022/0389917 A1 Dec. 8, 2022

Related U.S. Application Data

(60) Provisional application No. 63/270,486, filed on Oct. 21, 2021, provisional application No. 63/196,482, filed on Jun. 3, 2021.

(51) Int. Cl.
*F04B 17/04* (2006.01)
*A47K 5/12* (2006.01)
(Continued)

(52) U.S. Cl.
CPC .......... *F04B 17/046* (2013.01); *A47K 5/1204* (2013.01); *A47K 5/1205* (2013.01); *A47K 5/1207* (2013.01); *A47K 5/1217* (2013.01); *A47K 5/16* (2013.01); *B05B 11/1001* (2023.01); *B05B 11/1015* (2023.01);
(Continued)

(58) Field of Classification Search
CPC ...... A47K 5/1217; A47K 5/16; A47K 5/1205; A47K 5/1204; A47K 2005/1218; A47K 5/1207; F04B 17/046; F04B 23/028; F04B 17/042; F04B 13/00; F04B 17/04; F04B 49/10; F04B 53/1002; F04B 2207/70;
(Continued)

(56) References Cited

U.S. PATENT DOCUMENTS 2,761,392 A * 9/1956 Parker .................... H02K 33/12
417/550
2,862,450 A * 12/1958 McDonnell ............ H02K 33/12
417/550
(Continued)

FOREIGN PATENT DOCUMENTS

WO 2006123045 A2 12/2007

OTHER PUBLICATIONS

The International Search Report and the Written Opinion of the International Searching Authority, dated Oct. 26, 2022, 12 pages.
(Continued)

*Primary Examiner* — Peter J Bertheaud
(74) *Attorney, Agent, or Firm* — Lapple Ubell IP Law, LLP; Franklin D. Ubell

(57) ABSTRACT

Automatic electric actuation of the pumping mechanism of a liquid dispenser apparatus is provided by configuring a hollow tube to cooperate with an electromagnetically driven actuator and further configuring the hollow tube to inter-fit with a stem of a liquid dispensing pump. Actuation of the actuator may, for example, drive the pump stem downwardly to cause a pumping action. Suitable actuators include, for example, solenoids, voice coil actuators and stepping motors.

18 Claims, 15 Drawing Sheets

(51) Int. Cl.

| | |
|---|---|
| *A47K 5/16* | (2006.01) |
| *B05B 11/10* | (2023.01) |
| *F04B 13/00* | (2006.01) |
| *F04B 23/02* | (2006.01) |
| *F04B 49/10* | (2006.01) |
| *F04B 53/10* | (2006.01) |

(52) U.S. Cl.
CPC ...... *B05B 11/1046* (2023.01); *B05B 11/1047* (2023.01); *F04B 13/00* (2013.01); *F04B 17/04* (2013.01); *F04B 17/042* (2013.01); *F04B 23/028* (2013.01); *F04B 49/10* (2013.01); *F04B 53/1002* (2013.01); *A47K 2005/1218* (2013.01); *F04B 2207/70* (2013.01)

(58) Field of Classification Search
CPC ............. B05B 11/1052; B05B 11/1001; B05B 11/1015; B05B 11/1046; B05B 11/1047
See application file for complete search history.

(56) References Cited

U.S. PATENT DOCUMENTS

| | | |
|---|---|---|
| 4,282,501 A | 8/1981 | Myers |
| 4,938,384 A * | 7/1990 | Pilolla ................. A47K 5/1217 |
| | | 250/221 |
| 6,246,565 B1 | 6/2001 | Belfatto, Sr. et al. |
| 9,341,173 B2 | 5/2016 | Laughlin et al. |
| 9,636,699 B2 | 5/2017 | Doyle et al. |
| 9,913,562 B2 * | 3/2018 | Wegelin ............... A47K 5/1211 |
| 10,403,079 B2 * | 9/2019 | Wegelin ................. G07F 9/001 |
| 10,473,014 B2 | 11/2019 | Qi |
| 2002/0189805 A1 | 12/2002 | Howard |
| 2005/0063841 A1 * | 3/2005 | Chen .................... F04B 17/046 |
| | | 417/555.1 |
| 2012/0125950 A1 | 5/2012 | Bouix et al. |
| 2013/0243609 A1 | 9/2013 | Conley et al. |
| 2018/0283332 A1 * | 10/2018 | Nong .................... F02M 69/02 |

OTHER PUBLICATIONS

Voice coil actuators vs. solenoids, CMM probes, software and retrofits, https://www.aerospacemanufacturinganddesign.com/article/coil-actuators-vs-solenoids-manufacturing-aerospace-automotive-102815/, Oct. 10, 2021, pp. 1-7.
Solenoid, Wikipedia Oct. 10, 2021, pp. 1-12.
Voice Coil Actuator, Magnetic Innovations, Oct. 14, 2021, 4 pages.
Johnson Electric Tech Brief, Understanding Pull and Push Solenoids, Oct. 10, 2021, 12 pages.
NPM Nippon Pulse, May 6, 2022, 1 page.
Stepper motor; Wikipedia May 17, 2022, pp. 1-16.

* cited by examiner

ELECTRICALLY ACTUATED PUMP

RELATED APPLICATIONS

This application claims the benefit of and priority to U.S. Provisional Patent Application Ser. No. 63/196,482, filed Jun. 3, 2021, as well as the benefit of and priority to U.S. Provisional Patent Application No. 63/270,486, filed Oct. 21, 2021, both entitled, "Electrically Actuated Pump," the contents of each of which applications is incorporated by reference herein in its entirety.

FIELD OF THE INVENTION

This application relates to liquid dispenser apparatus and more particularly to an electrically actuated pump for such apparatus which enables automatic dispensing of a liquid into the hands of a user.

SUMMARY

Illustrative embodiments may implement a method comprising configuring a hollow tube to cooperate with an electromagnetic actuator such that the electromagnetic actuator is actuatable to drive the hollow tube at least downwardly in response to one or more electric pulses delivered to the actuator and inserting the hollow tube into a pump stem of a liquid pump body. In various embodiments, the electromagnetic actuator may comprise a solenoid, a voice coil actuator or a stepper motor. In other embodiments, the actuator may be configured to drive the hollow tube upwardly as well as downwardly. In such embodiments, the pump may be modified to eliminate a spring component thereof and to employ a trap configured to control positioning of a check ball component of the spring-less pump.

Illustrative embodiments may further comprise an electromagnetic actuator such as stepper motor, solenoid device or voice coil actuator having a hollow tube positioned therein and configured to drive the hollow tube up and down, the hollow tube being constructed to inter-fit with a stem of a pump such that driving the hollow tube up and down creates a pumping action. Such apparatus may further comprise a trap installed to control positioning of a check ball component of the pump and having one or more grooves formed therein to enable liquid flow through the trap.

Another illustrative embodiment may comprise a method comprising disposing a liquid dispenser tube of a liquid dispenser apparatus to fluidly communicate with a pump top opening; and disposing the liquid dispenser tube within an armature of one or more solenoid coils or at least one solenoid coil.

Another illustrative embodiment may comprise a method comprising configuring a hollow tube to be driven up and down by a stepper motor and constructing the hollow tube to inter-fit with the stem of a pump such that up and down movement of the hollow tube creates a pumping action. Such a method may further include removing a spring of the pump and installing a trap to control positioning of a check ball component of the pump. Such a method may further include forming one or more grooves in the trap to enable liquid to flow through the trap. Such a method may further include forming one or more surfaces on the tube shaped to cooperate with a bracket to prevent the tube from rotating to thereby enable up and down movement of the tube.

Any of the embodiments described in the above paragraphs may further include one or more of generating a battery life signal or generating a signal indicative of the fluid level in the liquid dispenser apparatus.

DETAILED DESCRIPTION OF ILLUSTRATIVE EMBODIMENTS

Figure 1:
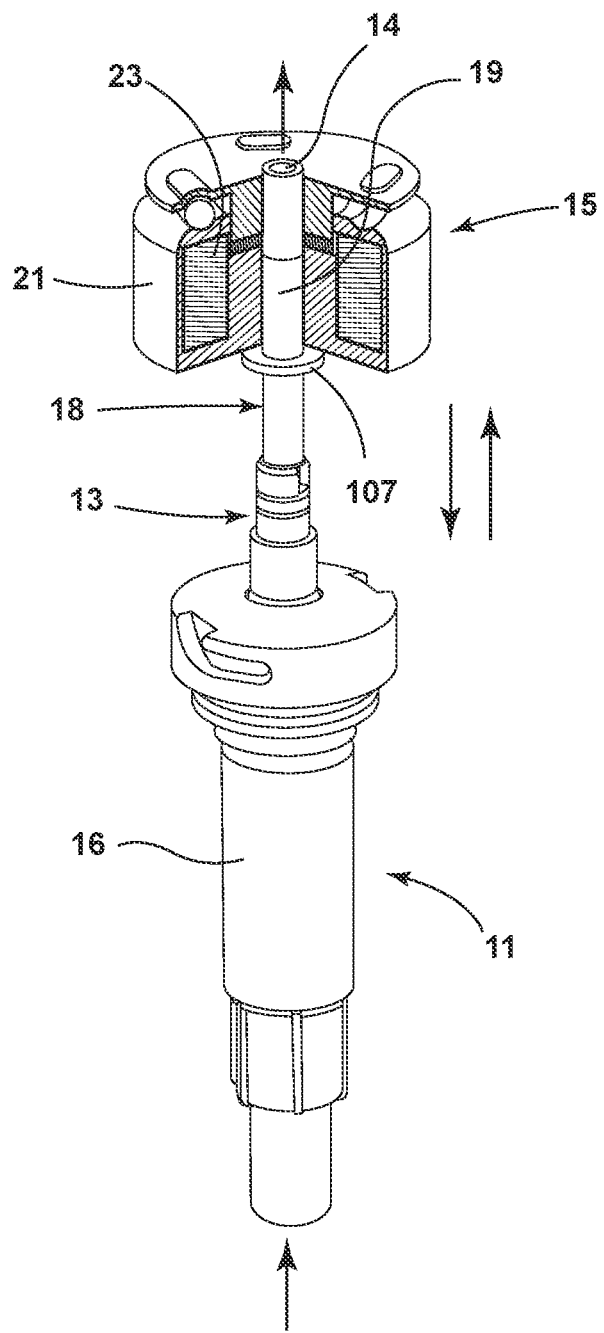
FIG. 1 is a perspective view of a pump equipped with a DC electric solenoid actuator according to an illustrative embodiment.

As shown in FIG. 1, an illustrative electrically actuated pump embodiment comprises a pump 11 having pump stem 13 and a solenoid actuator 15. A tubular plunger 18 attaches to the pump stem 13, for example, by a press-fit and has a top opening 14 from which liquid can be dispensed. The tubular plunger 18 and pump stem 13 are configured to move up and down in unison within and with respect to a pump body 16. In one embodiment, the pump 11 may be a conventional unit wherein, when the conventional pump stem 13 is manually depressed downwardly and released in a pumping action, liquid is dispensed out of the top opening 14. Thus, the stem 13 and plunger 18 are normally biased in an upward position, for example, by a spring or other biasing mechanism contained within the body 16 of the pump 11.

According to an illustrative embodiment, the tubular plunger 18 includes a ferromagnetic portion 19 shown positioned within the winding or coil 23 of the solenoid actuator 15. In this illustrative embodiment, the solenoid actuator 15 is fixed in position with respect to the pump 11 such that the plunger 18 may move up and down within and with respect to the solenoid actuator 15. In various embodiments, the tubular plunger 18 may be coated internally with a corrosion proof material or may be made of a stainless steel or other material sufficient to retard the corrosive aspects of various liquids.

In operation, the solenoid coil 23 is pulsed with electrical current, which drives the pump stem 13 down and then allows the spring bias of the pump 11 to drive the stem 13 back up to its normal position. Pulsing in this manner results in a pumping action which causes liquid to be dispensed out of the top end 14 of the stem 13.

Figure 2:
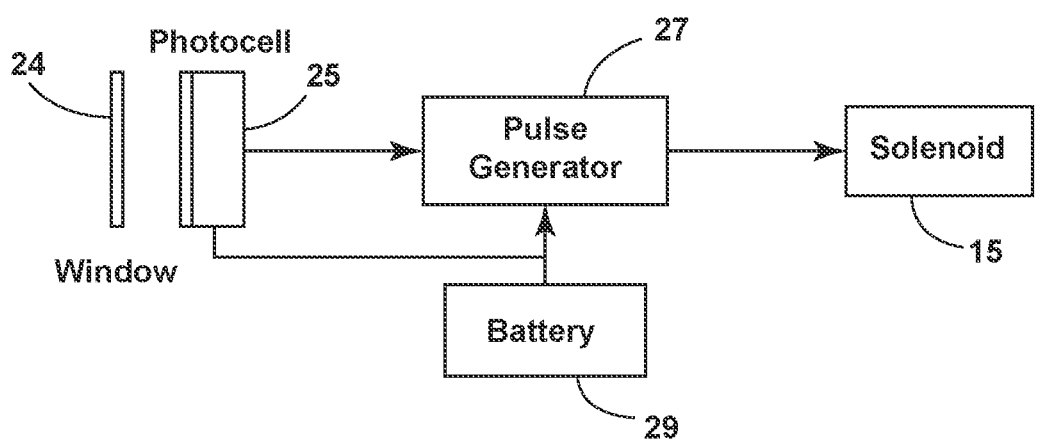
FIG. 2 is a schematic electrical circuit diagram of circuitry for driving the solenoid actuator of FIG. 1.
Figure 5:
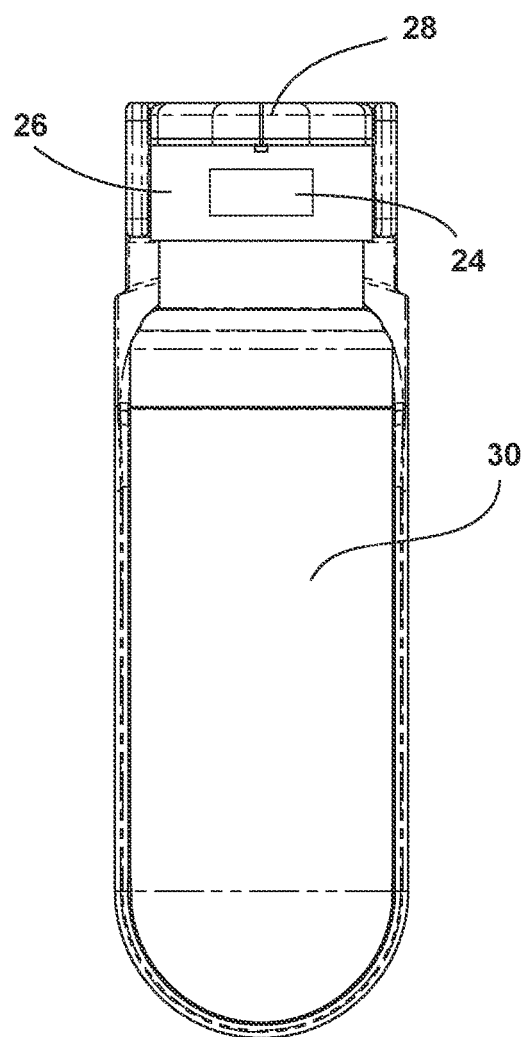
FIG. 5 is a front view of the apparatus of FIG. 4.
Figure 6:
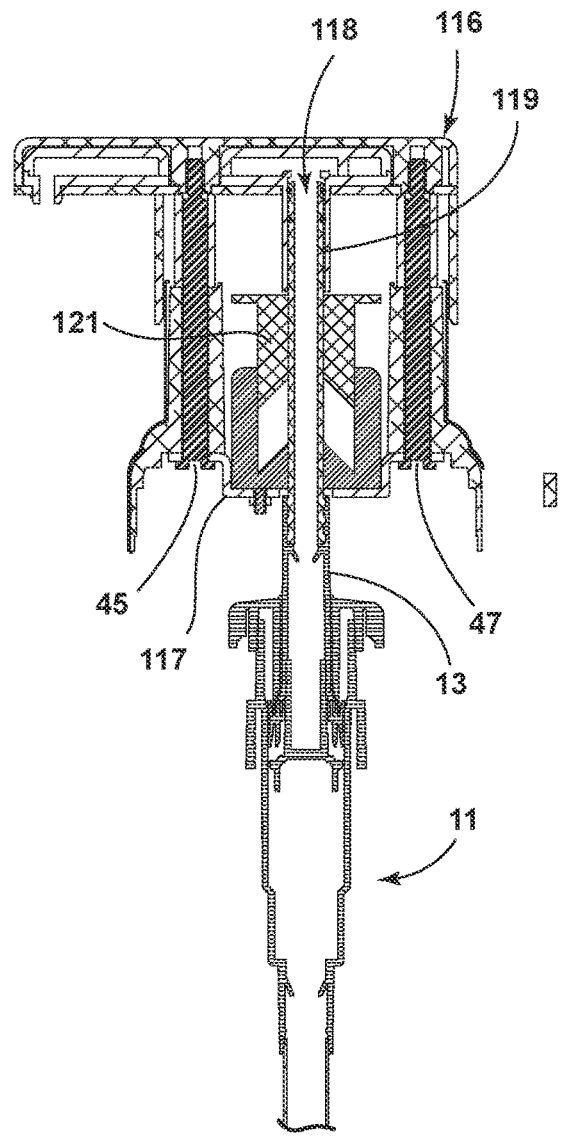
FIG. 6 is a cross-sectional view of a second illustrative embodiment of a pump equipped with a solenoid actuator in a de-energized state.

FIG. 2 illustrates one embodiment of drive circuitry for pulsing the solenoid 15, which includes a photocell 25, a pulse generator 27 and a battery or other power source 29. In one embodiment, the photocell 25 is positioned behind a window 24 on a cylindrical pump top neck 26 just under a pump top snout 28 of a liquid dispenser 30 as illustrated in FIGS. 5 and 6. In one illustrative embodiment, the photocell 25 senses the presence of a user's hand and provides a trigger signal to the pulse generator 27, which then outputs a current pulse which drives the solenoid actuator 15. In an illustrative embodiment, a single pulse is produced each time a hand is sensed. In one embodiment, the liquid dispenser 30 may be generally constructed pursuant to the teachings of U.S. provisional patent application Ser. No. 63/083,593, filed Sep. 25, 2020, and/or U.S. non-provisional application Ser. No. 17/402,071, filed Aug. 13, 2021 (now U.S. Pat. No. 11,332,279), both applications entitled "Liquid Dispenser Apparatus," which applications are incorporated by reference herein in their entirety.

In one embodiment, the solenoid actuator 15 may be powered by a six-volt DC battery pack 29. In another embodiment, the solenoid wires may run through a controller board configured to adjust or slow the speed of the linear movement of the pump stem 13. In one embodiment, the system is configured to provide, at minimum, 25,000 intermittent 0.5-inch actuations and provide a plunger force in the range of 1-Lb to 2-Lbs. In one embodiment, the maximum battery pack dimensions are 0.625" thick by 3.000" wide by 5.000" Tall.

A solenoid stem actuator according to another illustrative embodiment may be installed in a liquid dispenser apparatus as shown in FIGS. 6-12. In FIGS. 6-12, component 13 is the stem of a conventional pump into which a hollow tubular plunger 119 snap fits. A solenoid 115 is held in place in the dispenser apparatus by a mounting bracket 117 and guide pins 45, 47, which may thread into a pump head 116. Liquid to be dispensed flows out of the top end 118 of the tube 119 and into the pump head 116. The top end 118 is fitted with two O-rings 120, 122, FIGS. 9-10, which comprise a reciprocating seal.

Figure 7:
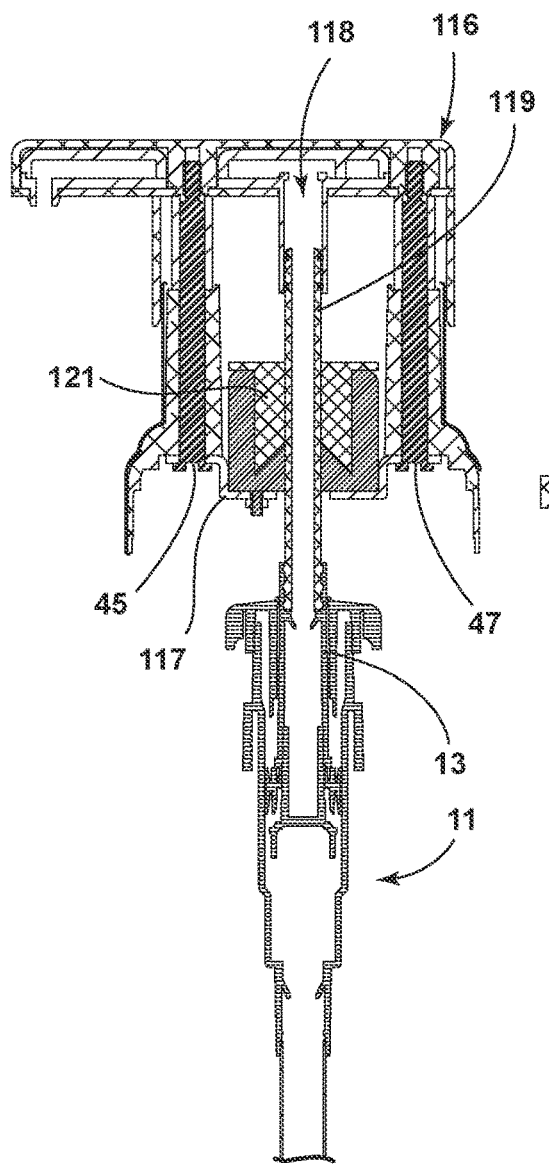
FIG. 7 is a cross-sectional view of the embodiment of FIG. 6 in an energized state.
Figure 8:
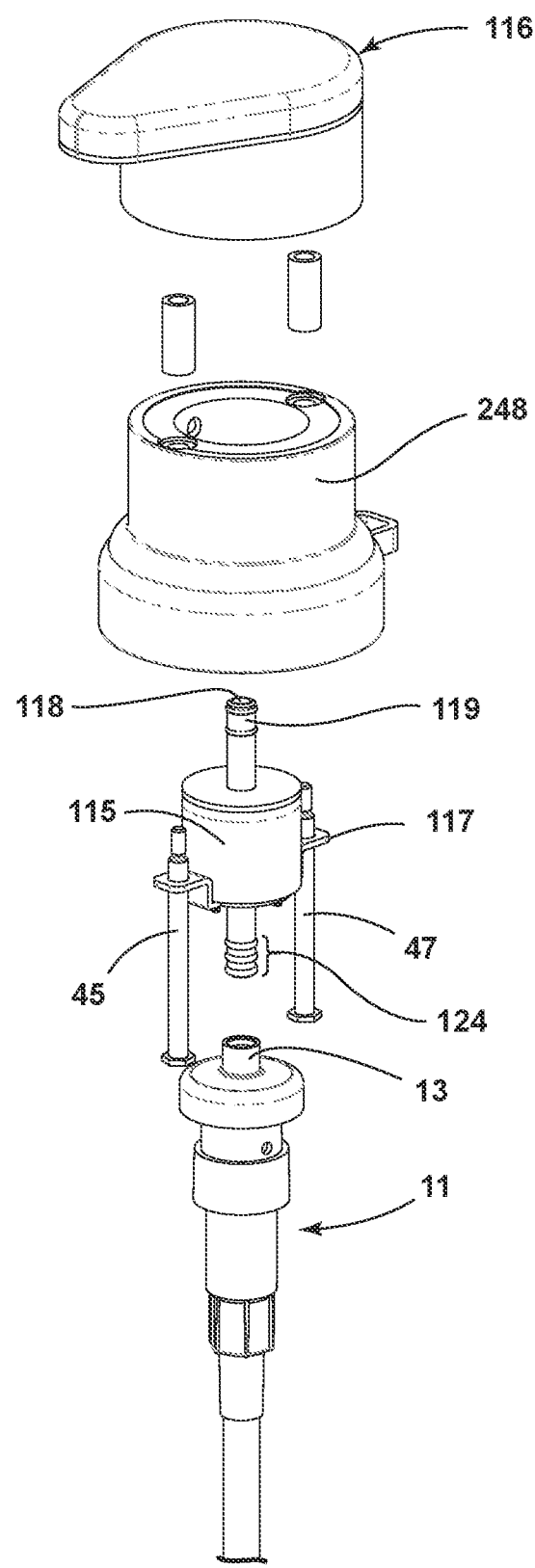
FIG. 8 is an exploded perspective view of the embodiment of FIGS. 6 and 7.
Figure 9:
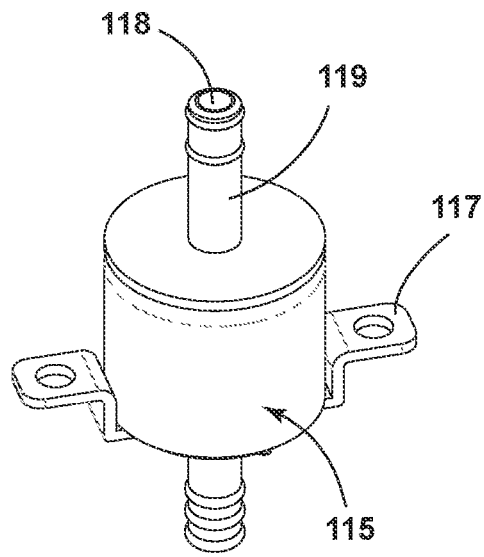
FIG. 9 is top perspective view of the solenoid actuator of the second illustrative embodiment.
Figure 10:
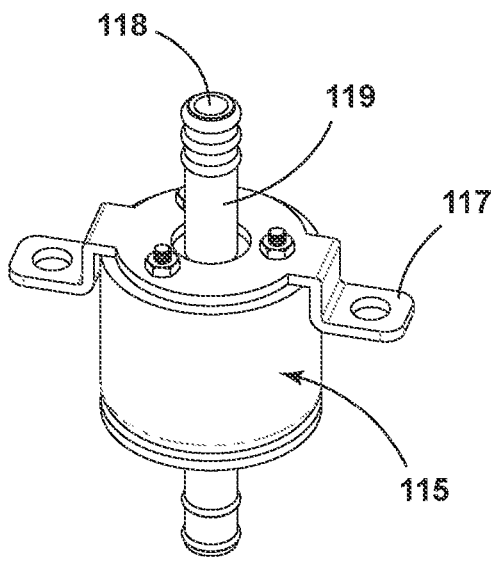
FIG. 10 is a bottom perspective view of the solenoid of FIG. 9.
Figure 11:
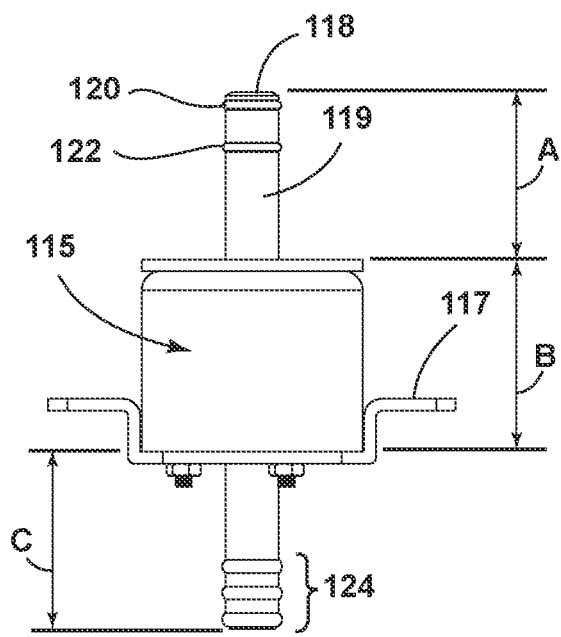
FIG. 11 is a side view of the solenoid of FIG. 9 in a first state.
Figure 12:
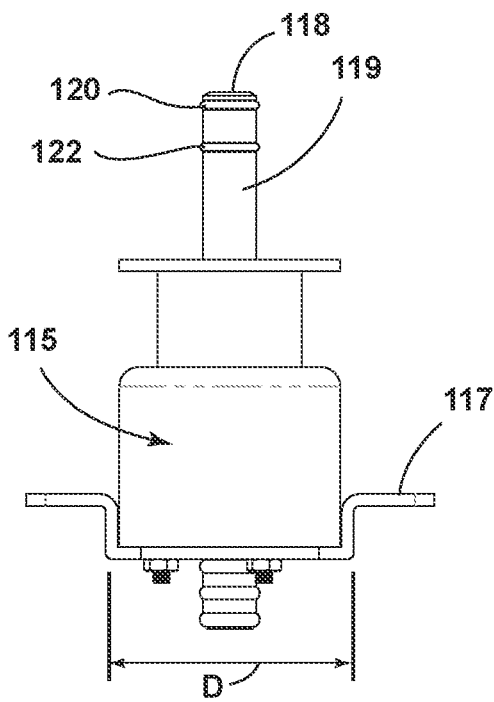
FIG. 12 is a side view of the solenoid of FIG. 9 in a second state.
Figure 13:
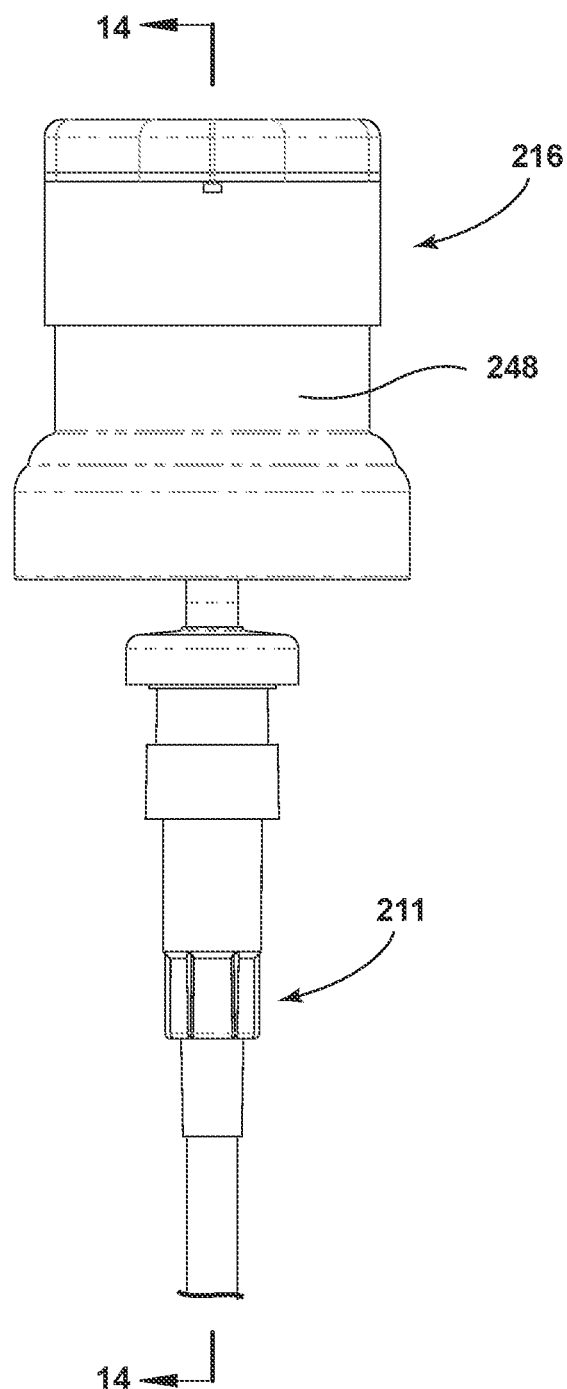
FIG. 13 is a front view of a third embodiment of a pump equipped with a solenoid actuator.

As seen in FIGS. 6 and 7, the solenoid 115 includes an armature 121 made of ferrous material which moves down in response to application of an energizing current to the solenoid 115. The tube 119 passes through and is attached to the armature 121 by press-fit or other attachment mechanism. In one embodiment, the tube 119 may be made of plastic but may be made of other materials such as steel or stainless steel in other embodiments. In one embodiment, the hole in the armature 121 which receives the tube 119 may be oversized to accommodate passage of the protrusions 124, FIGS. 8 and 11, which snap-fittingly mate with the conventional pump stem 13. In such an embodiment, a washer such as 107 in FIG. 1 may be attached to the tube 119 and then affixed to the top side of the armature 121 in order to cause the tube 119 to move in unison with the armature 121. In FIGS. 11 and 12, illustrative dimensions A, B, C, and D may be 0.875, 1.000, 0.927, and 1.150 inches, respectively, but may differ in various other embodiments.

A solenoid stem actuator according to another illustrative embodiment may be installed in a liquid dispenser apparatus as shown in FIGS. 13-17. The stem actuator of this embodiment eliminates the conventional return spring of the pump, thereby significantly decreasing the amount of force required to draw liquid up the tube of the device and hence also considerably reduces the size of the battery used in one embodiment to supply power to the actuator. In this illustrative embodiment, a push/pull solenoid is used to draw liquid through a tube running through and attached to the solenoid armature.

Figure 14:
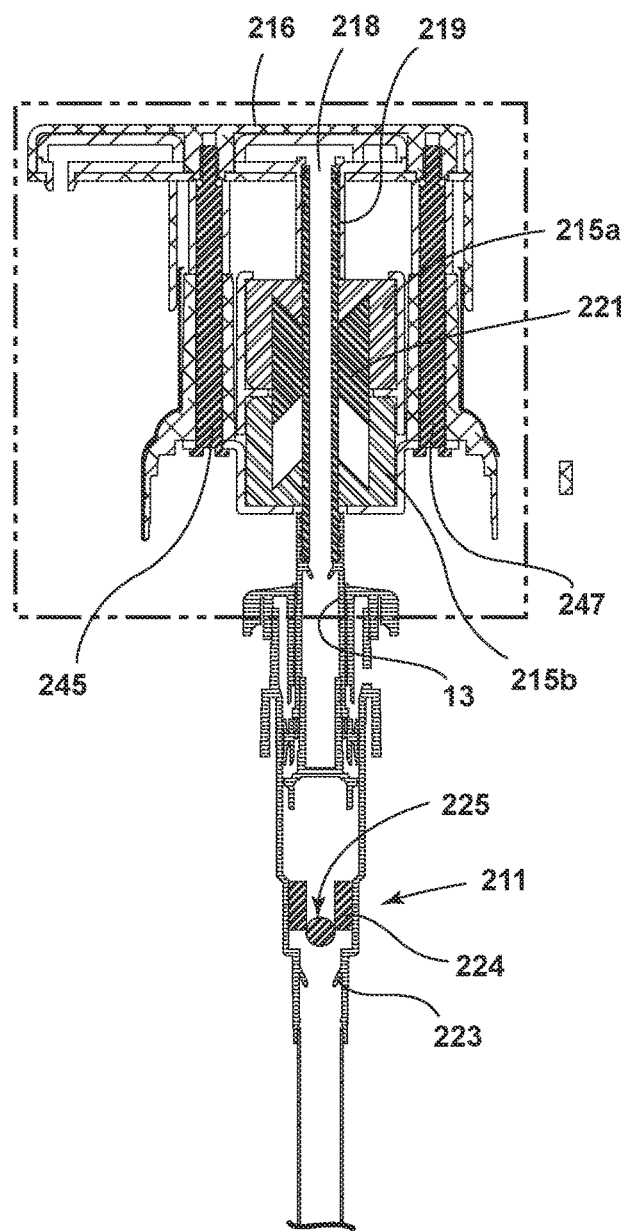
FIG. 14 is a side sectional view of the embodiment of FIG. 13 in a first state.
Figure 15:
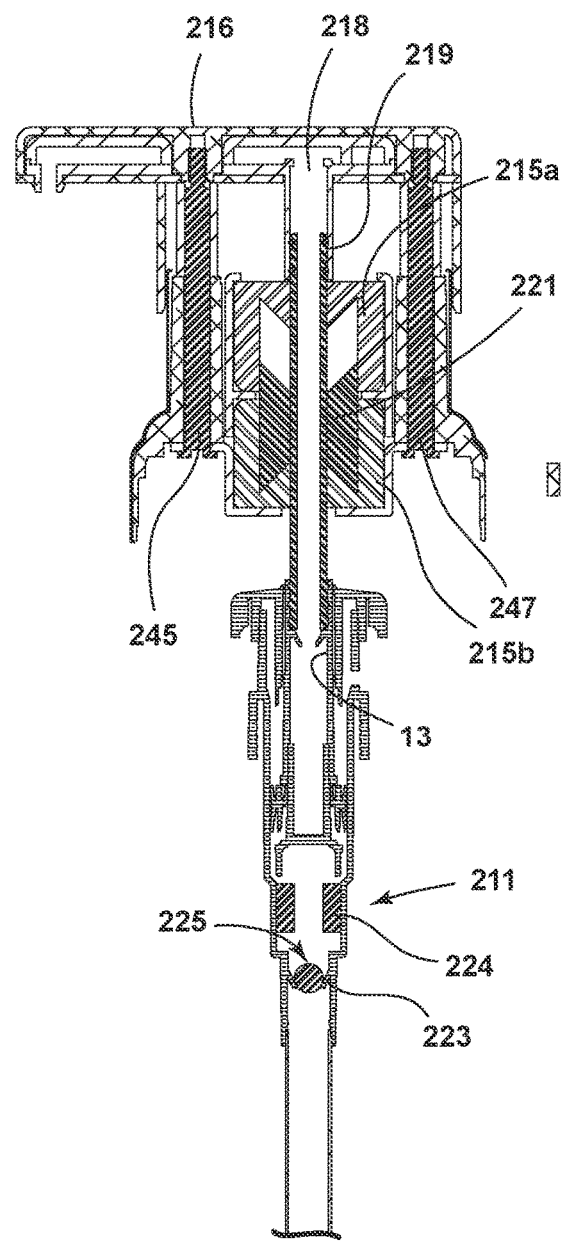
FIG. 15 is a side sectional view of the embodiment of FIG. 13 in a second state.
Figure 16:
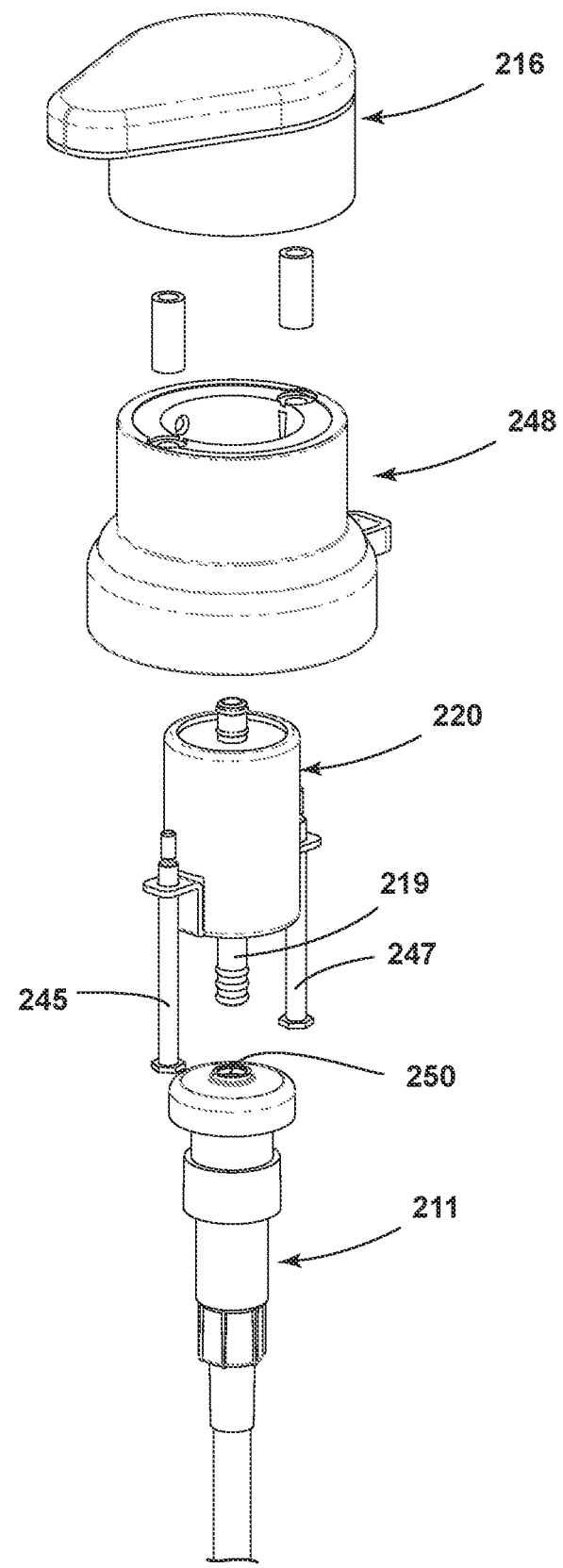
FIG. 16 is an exploded perspective view of the third embodiment.
Figure 17:
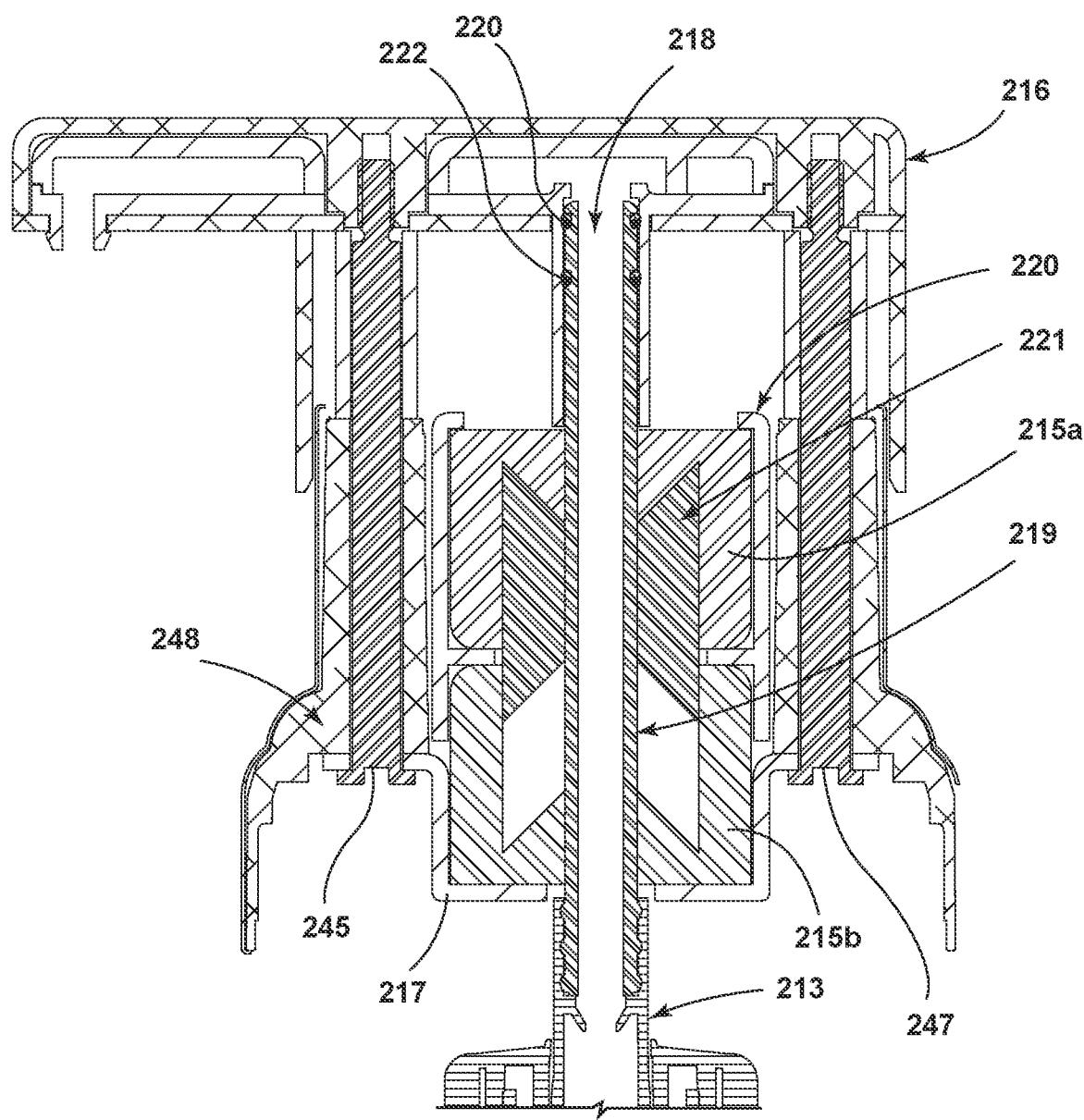
FIG. 17 is an enlarged partial side sectional view of the embodiment of FIG. 13.

As shown in FIGS. 14, 15 and 17, component 13 is the stem of a generally conventional pump into which a hollow tubular plunger 219 snap fits. A solenoid comprising a top coil 215a and a bottom coil 215b is held in place in the dispenser apparatus by a mounting bracket 217 and guide pins 245, 247, which may pass through a pump shroud 248 and thread into a pump head 216. A retaining frame 220 also wraps around, separates, and protects the two coils 215a, 215b. Notable aspects of this illustrative embodiment include the liquid conduit placement within an armature and liquid product flowing through the core of the armature.

Liquid to be dispensed flows out of the top end 218 of the tube 219 and into the pump head 216. The top end 218 may be fitted with two O-rings 220, 222, which comprise a reciprocating seal.

The solenoid comprising 215a and 215b includes an armature 221 made, for example, of ferrous, ferromagnetic, or conductive material which moves up and down in response to alternating application of an energizing current to the solenoid coils 215a, 215b. The tube 219 passes through and is attached to the armature 221 by press-fit or other attachment mechanism. In one embodiment, the tube 219 may be made of plastic but may be made of other materials such as steel or stainless steel in other embodiments.

In one embodiment, the hole in the armature 221 which receives the tube 219 may be over sized to accommodate passage of protrusions which snap-fittingly mate with the pump stem 13. In such an embodiment, a washer such as 107 in FIG. 1 may be attached to the tube 219 and then affixed to the top side of the armature 221 in order to cause the tube 219 to move in unison with the armature 221.

As illustrated in FIGS. 14 and 15, the pump body 211 is modified to incorporate a trap 224 to capture the conventional check ball 225 located at the bottom of the generally conventional liquid dispenser pump body. Removal of the conventional spring of the pump body causes erratic behavior due to turbulent displacement of the check ball, which is prevented by the trap 224. In one embodiment, the trap 224 may be cylindrically shaped and may press-fit into or otherwise attach to a concentric inner bottom shelf of the pump body 211. The trap 224 retains the check ball 225 and contains vertical grooves which allow the liquid to be dispensed to flow past the check ball 225 and into the pump body 211.

In operation of the embodiment of FIGS. 14 and 15, when the top coil 215a is energized via suitable control circuitry, the armature 221 is drawn upwards, which draws the pump plunger 219 upwards as shown in FIG. 14. This action creates a vacuum within the pump body 211 causing suction within the liquid dip tube, thus drawing the liquid vertically upward through the dip tube. The vacuum within the pump body 211 combined with the motive force of the liquid push the check ball 225 out of its bottom seat 223 and vertically upward into the trap 224 as shown in FIG. 14. The trap 224 prevents the ball from traveling further into the pump body 211, while. allowing the liquid to flow past the check ball 225 and into the pump body 211. At this position the pump plunger 219 has stopped at the vertical upper-bound extreme of its travel, the pump body 211 is filled with liquid, and the check ball 225 sinks a short distance into its lower seat 223, as shown in FIG. 15.

With the pump now primed to dispense liquid, the lower coil 215b is now energized by the control circuitry, which draws the armature 221 downwards, which draws the pump plunger downwards toward its lower-bound maximum. This action pushes the liquid against the seated check ball 225 forming a liquid tight seal at the bottom of the pump body 211, further pressurizing the pump body 211 and forcing the liquid out the top 250 (FIG. 16) of the pump body 211, up through the hollow tube 219, and out of the pump top 218 and spout, thus squirting into the hand of a consumer.

Illustrative embodiments may include a battery life sensor and a sensor that signals when the dispenser is empty. A Bluetooth transmitter/transceiver may also be included to transmit battery life signals and "empty" signals to, for example, a central maintenance site.

Figure 3:
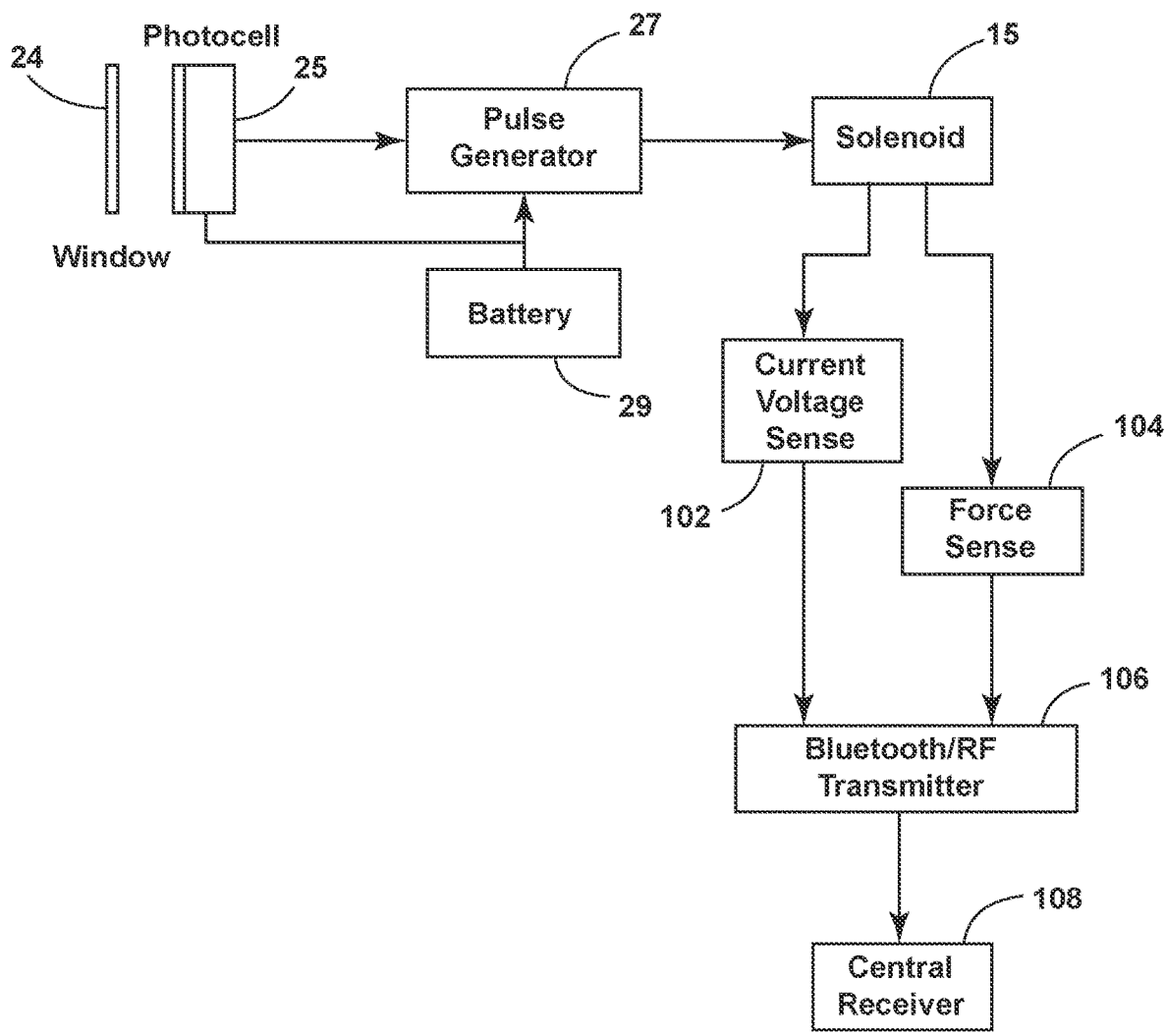
FIG. 3 is a schematic electrical circuit diagram of alternate circuitry for driving a solenoid actuator and sensing liquid level and battery state.
Figure 4:
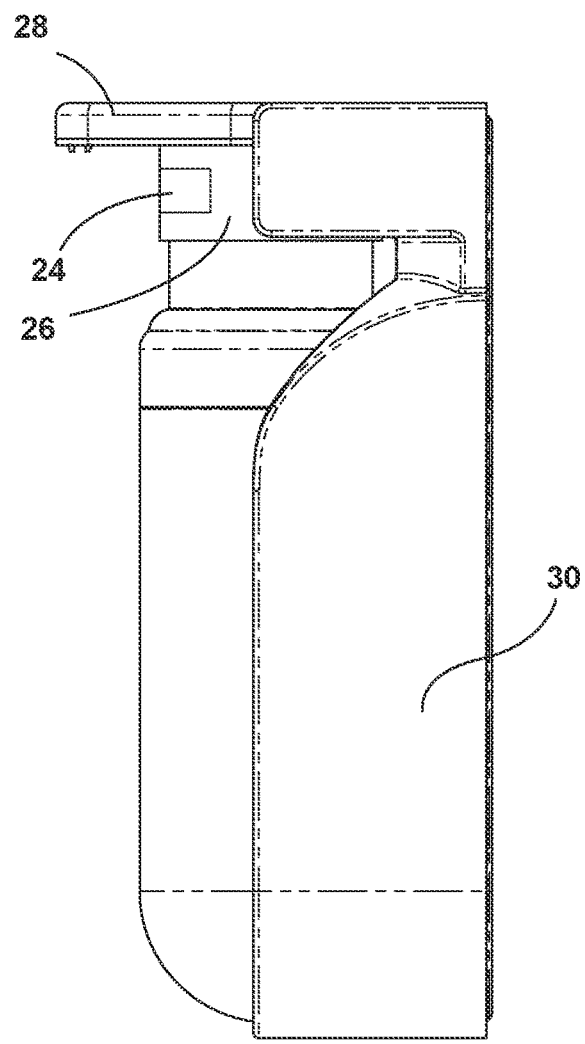
FIG. 4 is a side view of a liquid dispenser apparatus.

The illustrative embodiment shown in FIG. 3 includes a voltage/current sensor 102 and a force sensor 104 cooperating with the solenoid 15 both connected to a Bluetooth transmitter 106, which in turn communicates with a central receiver 108. An "empty" signal may be generated by employing the sensor 104 to sense the force within the solenoid 15 that is required to move the pump plunger. When this force drops below a pre-determined set-point, the change in force is sensed. In one illustrative embodiment, a controller on a control board then generates a signal sent via the Blue Tooth/RF transmitter 106 to the receiver 108 where the address of the signal is identified on a central display board for a technician to note and schedule a liquid refill.

In illustrative embodiments, a battery-life signal may be continuously monitored on a scale or generated as a "replace" signal at a programmed set-point. In an illustrative embodiment, the current or voltage drop coming into the solenoid 15 is sensed by the voltage/current sensor 102, and a change is detected at the control board where a signal is generated and sent via Blue Tooth/RF to the central receiver 108 where the address of the signal is identified for a technician to note and schedule a battery replacement.

Alternative embodiments may employ a voice coil actuator in lieu of solenoid actuation by employing actuators similar to moving magnet actuator part number MI-MMB-3070 as available from Magnetic Innovations located at Habraken 2150, 5507 TH Veldhoven, The Netherlands or a moving coil actuator similar to part number NCC05-11-011-1X as available from H2W Technologies located at 26380 Ferry Ct., Santa Clarita, CA 91350, either unit being modified, for example, with a through hole and liquid conduit tube inserted therethrough and secured therein. Such embodiments may be particularly adapted to springless pump embodiments similar to those described in connection with FIGS. 13-17.

In other alternate embodiments, a stepper motor may be used to drive a hollow liquid conducting tube up and down, or down only. As known in the art, a stepper motor may comprise a gear-shaped iron rotor with a number of teeth surrounded by a circular array of electromagnets. A first electromagnet is turned "on," attracting the nearest teeth of the gear-shaped iron rotor into an aligned position with the first electromagnet. With the teeth so aligned, they will be slightly offset from a second electromagnet of the array. Next, the first electromagnet is turned off, and the second electromagnet of the array is energized, pulling the rotor teeth into alignment with the second electromagnet and slightly offset from the teeth of a third electromagnet of the array, which results in a rotation of the rotor by a selected number of degrees. The second electromagnet is then de-energized and a third electromagnet energized to pull the rotor into alignment with the third electromagnet, thus resulting in the rotor rotating through the same selected angle or "step."

Stepper motors are known which convert the rotation of a rotor into vertical linear motion of a solid metal shaft having a 5.0 millimeter (mm) outside diameter and positioned perpendicularly to the rotor. Such movement is achieved in one device by threading the shaft to threadably insert into an interior cylinder of the rotor. In such a device the shaft may be referred to as a "screw," And has a spiral or helical thread that converts rotational movement of the stepper motor to linear vertical movement. Such stepper motors are commercially available, for example, from Nippon Pulse of America, Inc., Radford, Va., such as part numbers PFCL 25-24 and PFCL 25-48.

Figure 18:
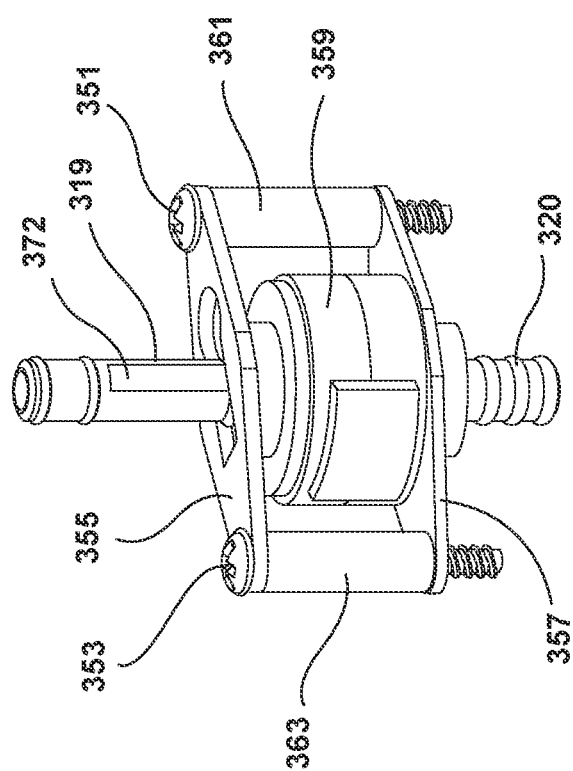
FIG. 18 is a perspective view of a stepper motor apparatus.

An illustrative embodiment of a stepper motor configured to operate as an electrically actuated liquid pump is shown in FIG. 18. In one embodiment, the solid metal screw of a conventional linear stepper motor is replaced with a hollow liquid-conducting threaded plastic tube 319 having an outside diameter of, for example, 8.00 mm selected to permit adequate liquid flow therethrough. Since the stepper motor 359 in this embodiment is a "non-captive" motor, the screw rotation is captured and stopped by a flat bracket 355, which grips the tube 319 to preclude rotation, while allowing up and down vertical movement of the tube 319.

The flat bracket 355 attaches to a base 357 which supports the motor 359 via screws 335, 353 and cooperating spacer sleeves 361, 363. In other embodiments, the hollow tube 319 could be formed of other materials such as, for example, stainless steel. The hollow tube 319 has a lower end 320 which is configured to fixedly inter-fit with a stem of a cooperating liquid dispensing pump.

In one embodiment, one complete revolution of an illustrative motor 359 requires 48 steps and 10 lbs. of linear force may be imparted to the tube 319. In operation, electrical pulses are applied to the motor 359 to cause a full downstroke of 0.5 inches of the tube 319 in one second and then to cause a full upstroke of 0.5 inches of the tube in one second. Such an embodiment employs a springless pump and the check ball control features discussed in connection with FIGS. 14 and 15.

Figure 19:
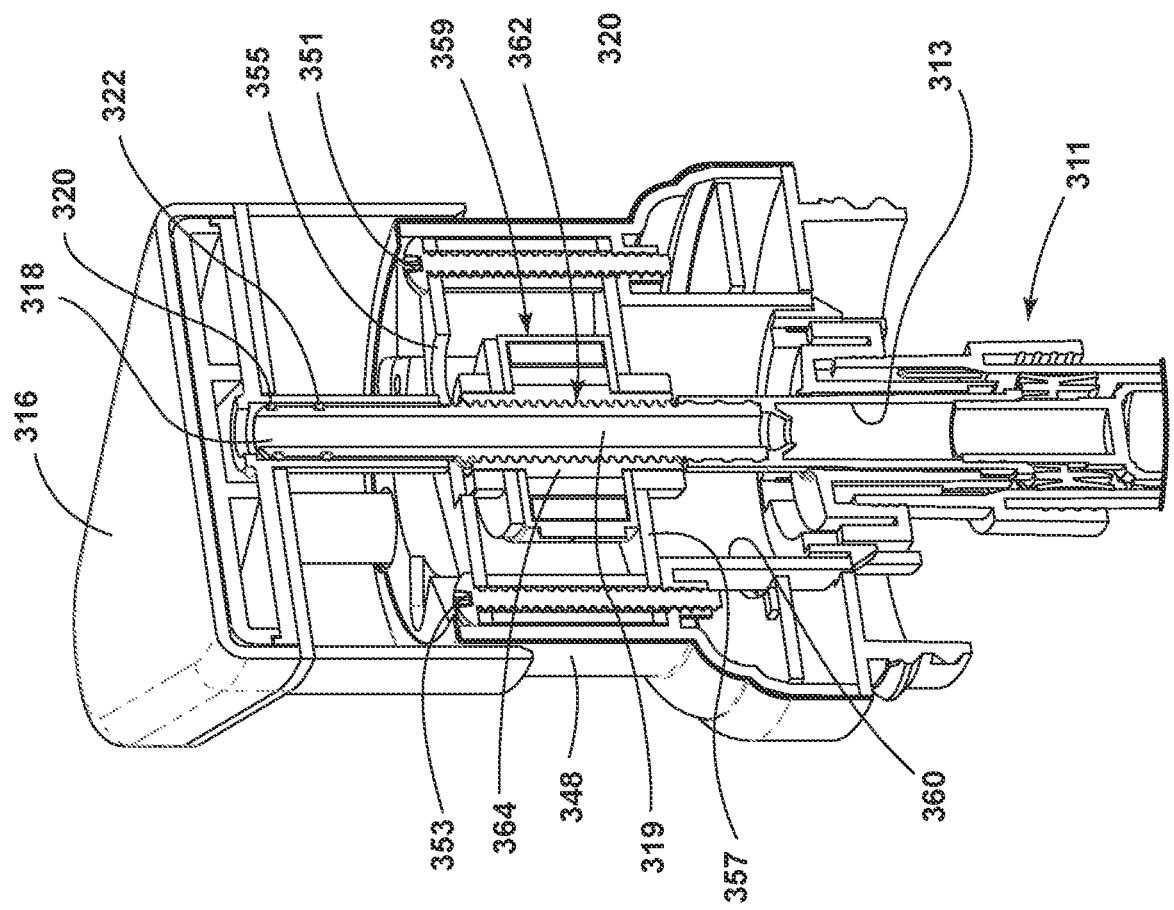
FIG. 19 is a first perspective sectional view illustrating the apparatus of FIG. 18 mounted in a liquid dispenser apparatus.
Figure 20:
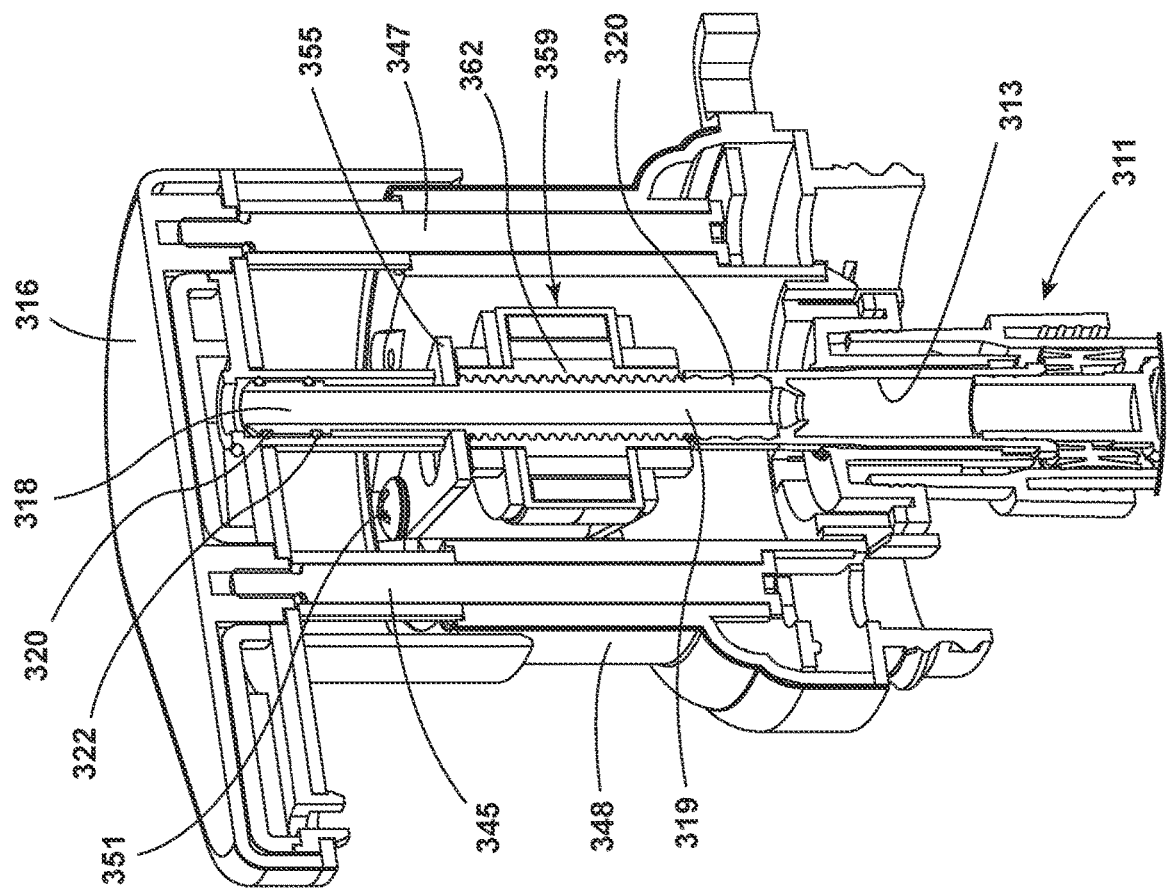
FIG. 20 is a second perspective sectional view of the apparatus of FIG. 19.

FIGS. 19 and 20 illustrate the stepper motor apparatus of FIG. 18 installed in a liquid dispenser apparatus. Here the dispenser apparatus includes a generally conventional liquid pump 311, a pump shroud 348, and a liquid dispensing pump head 316. Operation of the stepper motor 359 as described herein forces liquid out of the upper opening 318 of the hollow tube 319 and into and out of the pump head 316. A seal between the tube 319 and pump head 316 is provided by O-rings 320, 322. As may be seen, in the illustrated embodiment, the lower end 320 of the hollow tube 319 fixedly inter-fits with the stem 313 of the pump 311. As seen in FIG. 19, the base support 357 supporting the stepper motor 359 rests on the horizontal edges of a generally cylindrical support member 360 into which the screws 351, 353 thread.

FIGS. 19 and 20 further show the helically threaded portion 362 of the hollow liquid conducting tube 319 which is arranged to spin within a helically threaded nut 364 of the motor 359. The subject motor configuration is "non-captive" in that the spin of the tube 319 is not stopped by the motor itself, and thus "not captive." If the motor 359 is fastened down as in the illustrative embodiment, and the tube 319 is not allowed to spin in unison with the nut 364, i.e. by action of the bracket 355, then the tube 319 will thread vertically in and out of the motor 359 on the internal nut 364 that is spinning in stepped fashion inside the motor 359. If the motor 359 spins one way it will pull the tube 319 linearly in one direction, and if the stepped spin of the motor 359 is reversed, it will push tube 319 in the other direction. Other embodiments could employ a "captive' motor which includes an internal spline to capture the shaft or in this case, a hollow liquid conducting tube.

Figure 22:
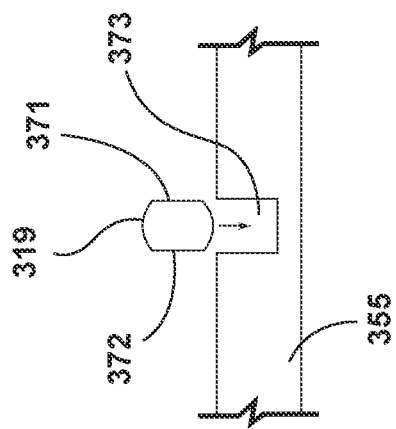
FIG. 22 is a partial top view of the bracket and tube of FIG. 21.
Figure 21:
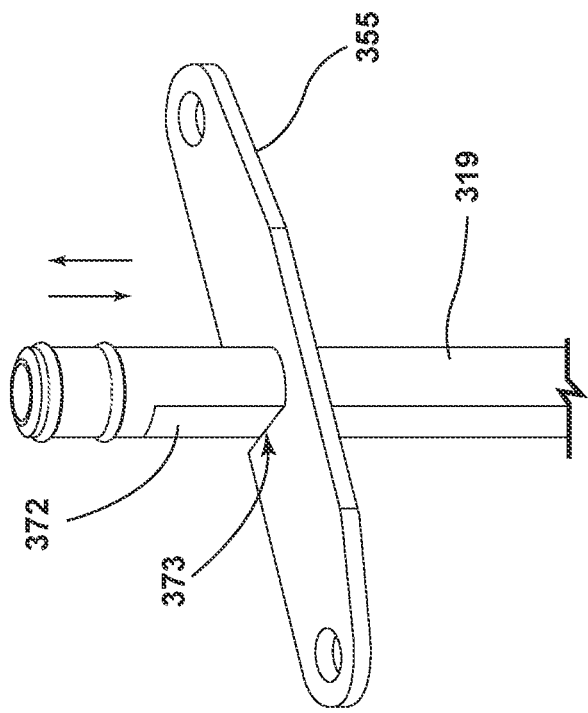
FIG. 21 is a perspective view of a bracket adapted to prevent rotation of a hollow liquid transferring tube according to an illustrative embodiment.

In the illustrative embodiment, as shown in FIGS. 21 and 22, the tube 319 is prevented from rotating by forming flat surfaces 371, 372 on opposite sides of the upper portion of the tube 319, for example, by grinding, and forming a rectangular notch 373 in the bracket 355 into which the flat surfaces 371, 372 fit. The notch 373 and flat surfaces 371, 372 cooperate to prevent the tube 319 from rotating while allowing it to move up and down vertically. Other structures for accomplishing the same result may be employed in other embodiments.

Alternate embodiments need not employ a stepper motor, but instead may employ a motor of other rotary forms. Such a motor could be stopped and reversed with switches mounted on or near; and/or interacting with, and as a function of the shaft or tube displacement.

The illustrative stepper motor embodiments just described may be configured to cooperate with circuitry such as that illustrated in FIG. 3 to monitor battery life and liquid level.

From the foregoing, those skilled in the art will appreciate that various adaptations and modifications of the just described illustrative embodiments can be configured without departing from the scope and spirit of the invention. Therefore, it is to be understood that, within the scope of the appended claims, the invention may be practiced other than as specifically described herein.

What is claimed is:

1. An apparatus comprising:
   a pump having a pump stem extending from a top surface thereof, the pump stem having a liquid dispensing opening and being normally biased in an upward position, the pump being constructed such that manual depression of the pump stem and subsequent release causes liquid to be dispensed from said liquid dispensing opening;
   a solenoid coil positioned outside of and above the pump and outside of and above the pump stem;
   a hollow liquid conducting plunger positioned within the solenoid coil and configured to interconnect with the pump stem so as to receive liquid to be dispensed from the liquid dispensing opening of the pump stem and having a ferromagnetic portion positioned thereon, the hollow liquid conducting plunger having a liquid dispensing opening located at a top end thereof; and
   the solenoid coil and the plunger being so configured that pulsing the solenoid coil with electrical current drives the plunger and pump stem down thereby causing liquid to be dispensed out of the liquid dispensing opening of the hollow liquid conducting plunger.

2. The apparatus of claim 1 further comprising:
   a sensor for detecting the presence of a user of the apparatus and generating a trigger signal in response to detection of the user; and
   a pulse generator responsive to said trigger signal to pulse said solenoid coil so as to drive said plunger and pump stem down.

3. The apparatus of claim 2 wherein said sensor is a photocell.

4. The apparatus of claim 3 wherein said photocell is located behind a window of a liquid dispenser.

5. The apparatus of claim 1 wherein the ferromagnetic portion comprises an armature.

6. The apparatus of claim 2 wherein said pulse generator is powered by a battery.

7. The apparatus of claim 1 further configured to generate a signal indicating that a liquid reservoir with which the pump cooperates is empty.

8. The apparatus of claim 7 further configured to transmit a signal via a wireless protocol indicating battery strength and/or that the reservoir is empty.

9. An apparatus comprising:
   a pump having a pump stem, the pump stem having a liquid dispensing opening at a top end thereof, the pump and pump stem being configured such that manual depression of the pump stem creates a pumping action;
   first and second solenoid coils positioned outside of and above the pump and outside of and above the pump stem;
   a hollow liquid conducting plunger positioned within the first and second solenoid coils and above the pump and pump stem and configured to interconnect with the pump stem so as to receive liquid dispensed from the liquid dispensing opening of the pump stem and having an armature positioned to move up and down within the first and second solenoid coils, the hollow liquid conducting plunger having a liquid dispensing opening located at a top end thereof; and
   the first and second coils and hollow liquid conducting plunger being further configured such that the plunger and the pump stem move downwardly in response to an actuation current supplied to said first solenoid coil and upwardly in response to an actuation current supplied to said second solenoid coil to thereby cause liquid to be dispensed from the liquid dispensing opening of the hollow liquid conducting plunger.

10. The apparatus of claim 9 further comprising:
    a sensor for detecting the presence of a user of the apparatus and generating a trigger signal in response to detection of the user; and
    a pulse generator responsive to said trigger signal to pulse said first and second solenoid coils so as to drive said plunger and pump stem up and down so as to perform a liquid pumping action.

11. The apparatus of claim 10 wherein said sensor is a photocell.

12. The apparatus of claim 11 wherein said photocell is located behind a window of a liquid dispenser.

13. The apparatus of claim 9 further comprising a trap installed in place of a spring component of the pump the trap being configured to control positioning of a check ball component of the pump.

14. The apparatus of claim 13 wherein the trap has one or more grooves formed therein to enable liquid flow through the trap.

15. The apparatus of claim 9 further comprising circuitry for generating a signal indicative of fluid level in a liquid dispenser reservoir with which the pump cooperates.

16. The apparatus of claim 15 wherein the signal is an "empty" signal.

17. The apparatus of claim 16 further comprising a battery life signal generating circuit.

18. An apparatus comprising:
- a liquid dispenser comprising a canister closure having a pump top slidably mounted therein, the pump top being configured to move up and down with respect to the canister closure, the pump top having a liquid receiving opening therein and configured to conduct liquid from said liquid receiving opening to a liquid dispensing opening;
- a pump having a pump stem extending from a top surface thereof, the pump stem having a liquid dispensing opening;
- one or more solenoids positioned outside of and above the pump and outside and above the pump stem, the one or more solenoids being attached to the canister closure;
- a hollow liquid conducting plunger positioned within the one or more solenoid coils and configured to interconnect with the pump stem so as to receive liquid dispensed from the liquid dispensing opening of the pump stem; and
- the one or more solenoid coils and the hollow liquid conducting plunger being so configured that pulsing the one or more solenoid coils with electrical current causes liquid to be pumped out of the pump stem into the liquid dispensing plunger and then dispensed out of the liquid dispensing opening of the hollow liquid conducting plunger and into the liquid receiving opening of the pump top.

* * * * *